(12) United States Patent
Blanchard et al.

(10) Patent No.: US 9,905,398 B1
(45) Date of Patent: Feb. 27, 2018

(54) SYSTEM AND TOOL FOR MANIPULATING INSERT

(71) Applicant: Varian Semiconductor Equipment Associates, Inc., Gloucester, MA (US)

(72) Inventors: Michael J. Blanchard, Marblehead, MA (US); Nevin H. Clay, Boxford, MA (US); Joshua R. Conahan, Haverhill, MA (US); Christopher Lupoli, Exeter, NH (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 0 days.

(21) Appl. No.: 15/489,153

(22) Filed: Apr. 17, 2017

(51) Int. Cl.
*H01J 37/317* (2006.01)
*H01J 37/30* (2006.01)

(52) U.S. Cl.
CPC ...... *H01J 37/3171* (2013.01); *H01J 37/3002* (2013.01)

(58) Field of Classification Search
USPC .................................................. 250/492.21
See application file for complete search history.

(56) References Cited

U.S. PATENT DOCUMENTS

| 9,730,719 B2* | 8/2017 | Brisson ............ A61B 17/32001 |
| 2012/0150154 A1* | 6/2012 | Brisson .................. A61B 17/00 606/1 |

* cited by examiner

*Primary Examiner* — Kiet T Nguyen

(57) ABSTRACT

An apparatus may include a shaft and a base, where the base is affixed to a first end portion of the shaft, the base comprising a first end and a second end. The apparatus may further include a first end effector, where the first end effector is rotatably coupled to the first end of the base, wherein the first end effector is rotatable from a first closed position to a first open position. The apparatus may include a second end effector, where the second end effector is rotatably coupled to the second end of the base, wherein the second end effector is rotatable from a second closed position to a second open position. The apparatus may also include a spring, including a first spring end coupled to the first end effector, and a second spring end, coupled to the second end effector.

18 Claims, 5 Drawing Sheets

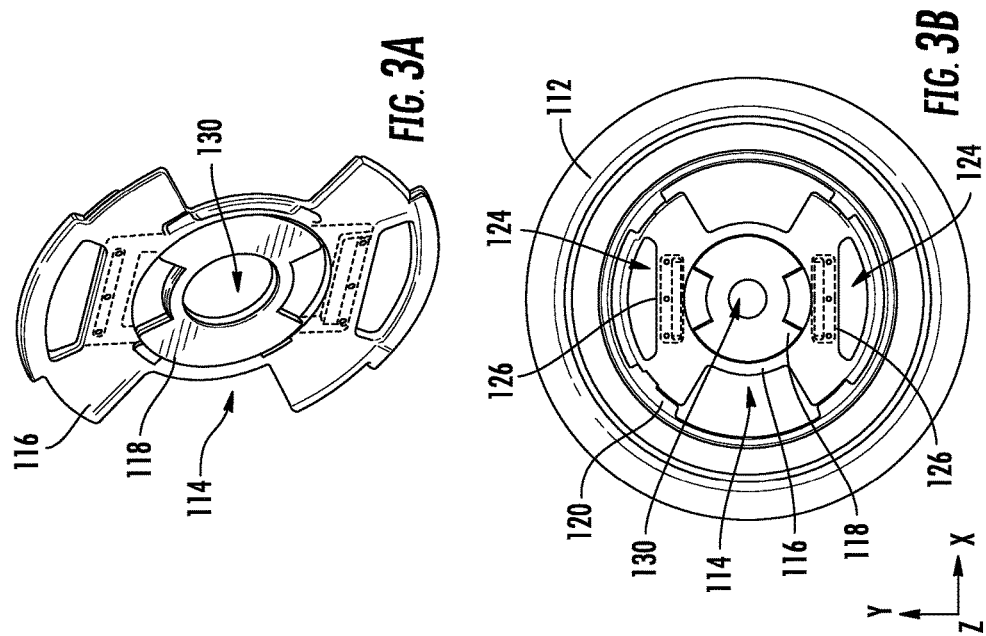
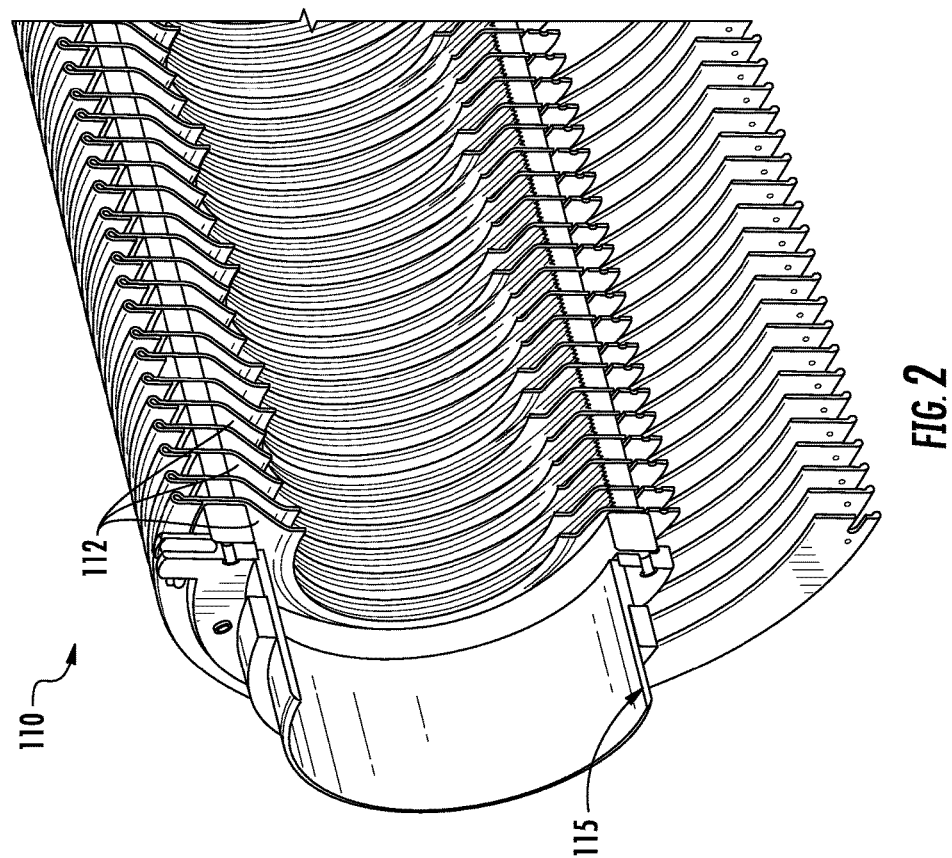

SYSTEM AND TOOL FOR MANIPULATING INSERT

FIELD

The present embodiments relate to apparatus having removable inserts, and more particularly to tools for manipulating removable inserts in beamline ion implanters.

BACKGROUND

In the present day, beamline ion implanters employ multiple components to direct an ion beam from an ion source to a substrate. In order to properly treat a substrate, the ion beam may be accelerated to a target ion energy, and may have the trajectory and shape manipulated by various beamline components to produce a set of target characteristics of the ion beam at the substrate. In many types of ion implanters, including medium energy and high energy ion implanters, an acceleration column(s) may be employed to accelerate or decelerate an ion beam in order to generate a target beam energy. A given acceleration column may include many electrodes arranged in electrical series fashion to accelerate an ion beam. For example, an acceleration column may include multiple electrodes having apertures to conduct the ion beam and arranged to increase a beam energy by applying a series of different potentials to the different electrodes. In this manner, the ion beam is accelerated according to the different potentials applied to the electrodes.

Depending upon the particular design capabilities for an apparatus, such as a targeted maximum beam energy, a component such as an accelerator column may be elongated along a beam axis to a length of one meter or more. Often an internal diameter of such a component may be on the order of a few hundred millimeters of less, rendering the component relatively inaccessible for manual repair, maintenance or cleaning.

With respect to these and other considerations the present disclosure is provided.

BRIEF SUMMARY

In one embodiment, An apparatus may include a shaft and a base, where the base is affixed to a first end portion of the shaft, the base comprising a first end and a second end. The apparatus may further include a first end effector, where the first end effector is rotatably coupled to the first end of the base, wherein the first end effector is rotatable from a first closed position to a first open position. The apparatus may include a second end effector, where the second end effector is rotatably coupled to the second end of the base, wherein the second end effector is rotatable from a second closed position to a second open position. The apparatus may also include a spring, including a first spring end coupled to the first end effector, and a second spring end, coupled to the second end effector.

In another embodiment, an electrode assembly may include an electrode insert, the electrode insert comprising a first grip surface and a second grip surface. The electrode assembly may also include a clamp tool, the clamp tool comprising a base, the base having a first end and a second end. The clamp tool may also include a first end effector, the first end effector being rotatably coupled to the first end of the base, and a second end effector, the second end effector being rotatably coupled to the second end of the base. The clamp tool may also include a spring, the spring comprising a first spring end, coupled to the first end effector; and a second spring end, coupled to the second end effector, wherein the first end effector and second end effector are arranged to generate a clamping force between the first grip surface and the second grip surface.

In a further embodiment, a method of maintaining an accelerator column, may include providing an electrode in the accelerator column, and inserting a clamp tool into the accelerator column when an electrode insert is coupled to the electrode, where the electrode insert comprises an electrode axis, a first grip surface and a second grip surface. The method may further include engaging the first grip surface and the second grip surface of the electrode insert with a first end effector of the clamp tool, and a second end effector of the clamp tool, respectively; and rotating the clamp tool about the electrode axis in a first direction, wherein the electrode insert is disconnected from the electrode.

BRIEF DESCRIPTION OF THE DRAWINGS

FIG. 1 and FIG. 2 illustrate an example of manipulating an electrode insert, according to embodiments of the disclosure;

FIG. 3A illustrates a perspective view of an electrode insert according to further embodiments of the disclosure;

FIG. 3B illustrates a plan view of the electrode insert of FIG. 3A;

Figure 1:
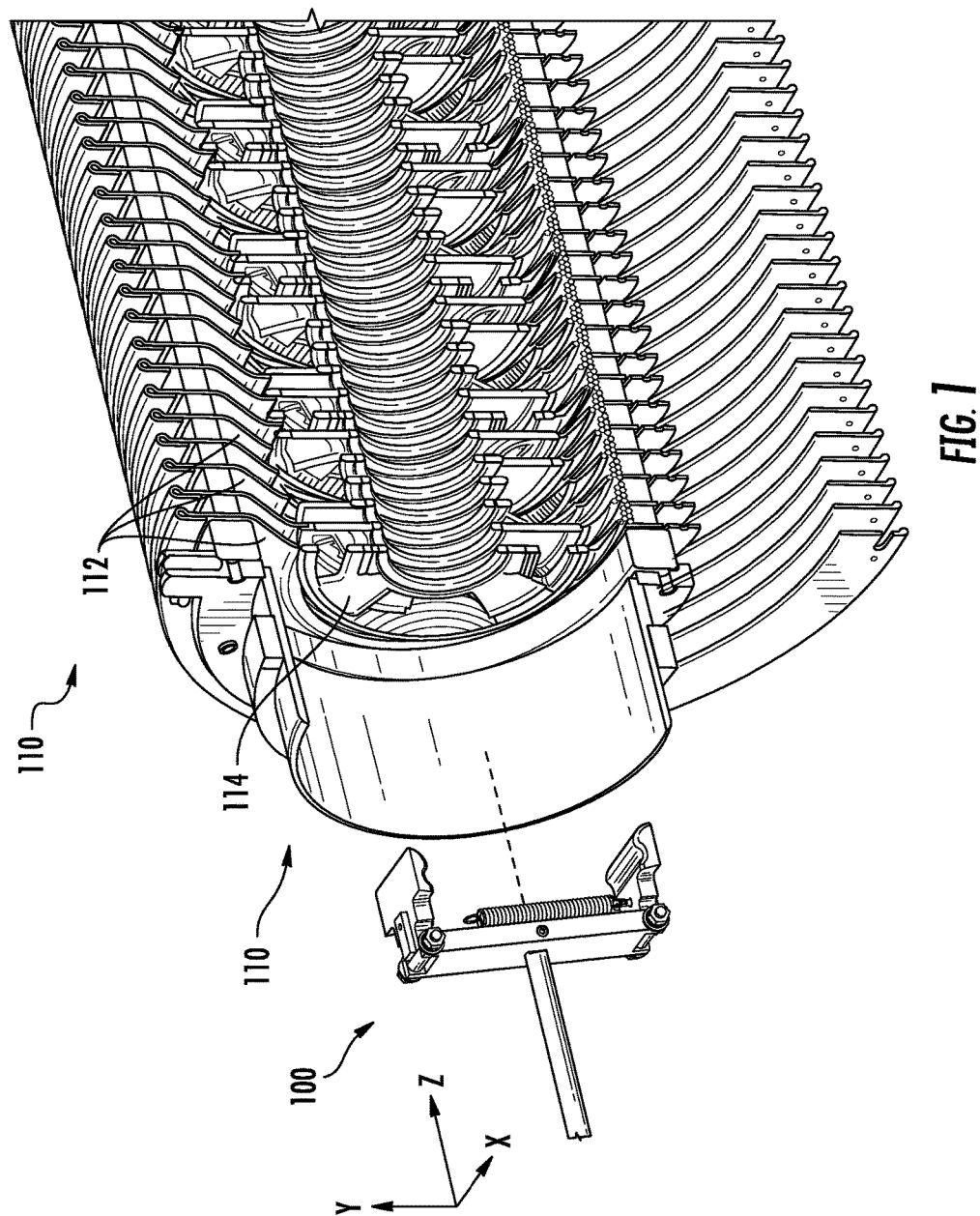

The drawings are not necessarily to scale. The drawings are merely representations, not intended to portray specific parameters of the disclosure. The drawings are intended to depict exemplary embodiments of the disclosure, and therefore are not be considered as limiting in scope. In the drawings, like numbering represents like elements.

Furthermore, certain elements in some of the figures may be omitted, or illustrated not-to-scale, for illustrative clarity. The cross-sectional views may be in the form of "slices", or "near-sighted" cross-sectional views, omitting certain background lines otherwise visible in a "true" cross-sectional view, for illustrative clarity. Furthermore, for clarity, some reference numbers may be omitted in certain drawings.

DETAILED DESCRIPTION

The present embodiments will now be described more fully hereinafter with reference to the accompanying drawings, where some embodiments are shown. The subject matter of the present disclosure may be embodied in many different forms and are not to be construed as limited to the embodiments set forth herein. These embodiments are provided so this disclosure will be thorough and complete, and will fully convey the scope of the subject matter to those skilled in the art. In the drawings, like numbers refer to like elements throughout.

The present embodiments are related to operating and maintaining apparatus having electrodes or other components, where such components may be reversibly attachable to the apparatus. Examples of the present embodiments involve ion beam processing apparatus such as beamline implanters. Various embodiments provide novel and improved electrode assemblies, as well as tools and methods for manipulating for manipulating electrode inserts. The present embodiments may be useful in beamline ion implanters where ion energy may range above 50 keV, and up to energies of 10 MeV, for example. The embodiments are not limited in this context.

FIG. 1 illustrates a perspective view of a clamp tool 100 and an accelerator column 110 in a first state. The accelerator column 110 may be an accelerator column, a decelerator column, or a combination of accelerator column/decelerator column in different embodiments. As such the accelerator column 110 may operate to manipulate an ion beam that is conducted through the accelerator column 110 according to known principles. In particular, the accelerator column 110 may include a plurality of electrodes, shown as electrodes 112, where these electrodes are used to establish varying potentials throughout the accelerator column, to manipulate ion beam potential so as to increase or decrease ion beam potential. Advantageously, the accelerator column 110 may include a plurality of electrode inserts, where a given electrode insert, shown as electrode insert 114, is electrically and mechanically coupled to an electrode 112.

In this configuration, the electrode insert 114 may be reversibly attachable to the electrode 112, so the electrode insert 114 may be removed from the accelerator column 110, cleaned, repaired, or replaced, while subsequently the electrode insert 114 may be reconnected to the electrode 112. FIG. 2 illustrates a perspective view of the accelerator column 110 in a second state, where the electrode inserts 114 have been removed. As shown, by providing a removable electrode insert, the accelerator column 110 provides for easier maintenance of other portions, such as surfaces between electrodes 112. Notably, the electrodes 112 do not extend far from the cylindrical inner wall, shown as wall 115, of the accelerator column 110, providing better access for cleaning of surfaces of the accelerator column 110, including the wall 115.

Advantageously, as detailed with respect to the embodiments to follow, a clamp tool such as clamp tool 100, may be employed to facilitate removal and installation of electrode inserts 114. As described below, the clamp tool 100 includes components to engage and manipulate the electrode inserts 114. In some embodiments the accelerator column 110 may facilitate removal of inserts 114, where the inserts 114 may be inaccessible by manual intervention. For example, the length of the accelerator column 110 may exceed 500 mm, 1000 mm, or 1500 mm in some examples, rendering access to electrode inserts 114 in some portions of the accelerator column 110 difficult or impossible by manual means. In order to properly access inserts disposed well away from an opening of the accelerator column 110, the clamp tool 100 may provide extension of operator reach for additional distances, such as 300 mm, 500 mm, 1000 mm, and so forth. The clamp tool 100 may particularly be arranged to engage the electrode inserts 114 in a manner providing easy rotation of the electrode inserts to remove or install the electrode inserts.

Turning now to FIG. 3A there is shown a perspective view of an electrode insert 114 according to further embodiments of the disclosure, while FIG. 3B illustrates a plan view of the electrode insert 114 of FIG. 3A. The electrode insert 114 may be used for manipulating an ion beam in a beamline ion implanter. In particular, the electrode insert 114, when coupled with the electrode 112, may form an electrode structure that is used in an accelerator column having a plurality of electrodes (such as accelerator column 110), where the plurality of electrodes generate a series of different voltages, arranged to accelerate an ion beam to a target potential (voltage).

The electrode insert 114 may include a frame 116, disposed around an inner portion 118. According to various embodiments, the electrode insert 114 may be reversibly attachable from the electrode 112, where the electrode 112 may be permanently or semi-permanently attached to the accelerator column 110. The term "reversibly attachable" as used herein means a component designed to be attached and detached from another component in a reversible manner. In various embodiments, the inner portion 118 may be made of a first electrically conductive material, the frame 116 may be made of a second electrically conductive material, while the electrode 112 may be made of a third electrically conductive material. In various embodiments the first material of the inner portion 118 may differ from the second material of the frame 116, while the second material of the frame 116 may differ from the third material of the electrode 112, as well as from the material of the inner portion 118. In some embodiments the material of the frame 116, inner portion 118 and electrode 112 may be the same material. In other embodiments the material of two of the components may be the same material, such as inner portion 118 and frame 116, while the material of the third component, such as the electrode 112 is a different material from the frame material and insert material. The embodiments are not limited in this context. In various embodiments, the material of the inner portion 118, as well as the material of the frame 116, and material of the electrode 112 may be chosen according to a target application. The electrode 112 and the electrode insert 114 accordingly provides a modular structure to allow different combinations of materials for the different components, where the materials are tailored to a given application.

In one embodiment, the electrode 112 may be formed of titanium, while the frame 116 is formed of aluminum and inner portion 118 is formed of carbon. Notably, while not shown in FIG. 3B, the electrode 112 may be affixed to the inside of the accelerator column 110. While the electrode 112 may remain affixed to the accelerator column 110, the electrode insert 114, being reversibly attachable, may be removed according for maintenance of the electrode insert 114 as well as the accelerator column 110. In the scenario in FIG. 3B, the electrode insert 114 is connected mechanically and electrically to the electrode 112. Thus, the electrode insert 114 together with electrode 112 act as an electrode component to guide an ion beam passing through the aperture 130 in the inner portion 118. As further shown in FIG. 3B, the electrode 112 may include a coupling portion, such as a plurality of tabs, shown as tabs 120, where the tabs 120 are arranged to engage and hold outer portions of the frame 116 of electrode insert 114. In other designs, instead of tabs, recesses, or similar features or combinations of features may be arranged to reversibly attach and detach the frame 116 of electrode insert 114 from the electrode 112.

While the electrode insert 114 may be manipulable by manual means, in various embodiments the electrode insert 114 and the clamp tool 100 may be so designed to provide simple, reliable and reversible mechanical coupling between the clamp tool 100 and the electrode insert 114. This mechanical coupling allows the clamp tool 100 to be employed to manipulate the electrode insert 114, instead of direct manual manipulation by an operator hand. As illustrated in FIG. 3B, the frame 116 may include a plurality of openings, shown as openings 124, where an opening 124 includes a grip surface 126. The grip surface 126 may define a straight surface in various embodiments.

Figure 4A:
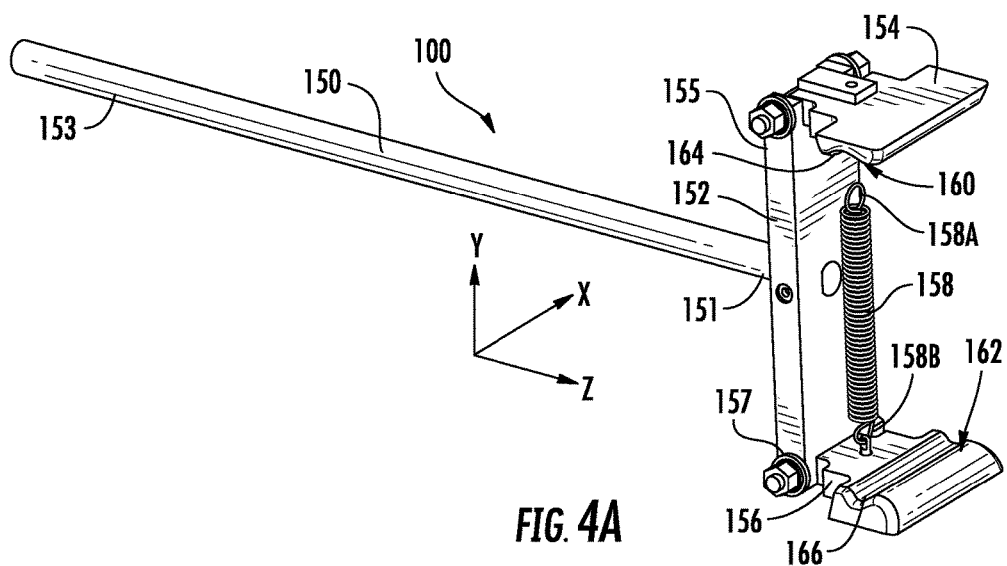
FIG. 4A illustrates a perspective view of a clamp tool according to embodiments of the disclosure.

Turning now to FIG. 4A there is shown a perspective view of the clamp tool 100 according to embodiments of the disclosure, where the clamp tool 100 is arranged to engage the electrode insert 114. As illustrated, the clamp tool 100 may include a shaft 150, where the shaft may have a shaft length of any desired length and may exceed 300 mm in some embodiments. The shaft may 150, but need not, be made of a material such as aluminum in some embodiments. Among other considerations, the shaft length for clamp tool 100 may be designed according to the size or length of an accelerator column to be serviced. The clamp tool 100 may also include a base, 152, where the base 152 is affixed to a first end portion 151 of the shaft 150. The base 152 may also be made of a material such as aluminum. The embodiments are not limited in this context.

A second end portion 153 of the shaft 150 may be connected to a handle (not shown) or other component to provide advantageous and convenient manipulation of the shaft. For example, in FIG. 4A, the shaft 150 may be deemed to define a shaft axis parallel to the long direction of the shaft 150, where rotation of the shaft about the shaft axis (corresponding to the Z-axis of the Cartesian coordinate system shown) is used to install and remove an electrode insert 114. In particular, the shaft 150 may be rigidly affixed to the base 152 so that rotation of the shaft 150 causes a concomitant rotation of the base 152. Accordingly, when the clamp tool 100 is clamped to the electrode insert 114, rotation of the shaft 150 may cause rotation of the electrode insert 114 about an electrode axis that coincides with the shaft axis. Because an electrode 112 may remain affixed to the accelerator column 110, the clamp tool 100 may thus rotate the electrode insert 114 with respect to the electrode 112, to engage or disengage from tabs 120.

In some embodiments, the shaft 150 and the base 152 may be formed from a metal material. In various embodiments, the shaft 150 may be rigidly connected to the base 152 using a simple coupling device, such as a bolt or screw. This coupling allows the length of the clamp tool 100 to be conveniently adjusted by choosing a shaft 150 of the appropriate length, and connecting or disconnecting the chose shaft to the base 152 through the simple coupling device.

As further shown in FIG. 4A, the clamp tool 100 may include a first end effector 154, and a second end effector 156. As illustrated, the first end effector 154 may be rotatably coupled to a first end 155 of the base 152, while the second end effector 156 rotatably coupled to a second end 157 of the base 152. In particular, the first end effector 154 may be rotatable from a first closed position to a first open position, while the second end effector is rotatable from a second closed position to a second open position. In the configuration of FIG. 4A, the first end effector 154 and the second end effector 156 may be deemed to be in closed positions.

The clamp tool 100 may further include an elastic coupling component, such as a spring 158, where the spring 158 has a first spring end 158A, coupled to the first end effector 154, and a second spring end 158B, coupled to the second end effector 156. For clarity, the first spring end 158A is shown as detached, while in operation, the first spring end 158A is attached to the first end effector 154. In this manner the spring 158 may generate a force urging the first end effector 154 to the first closed position and the second end effector 156 to the second closed position, as illustrated in FIG. 4A.

Figure 4B:
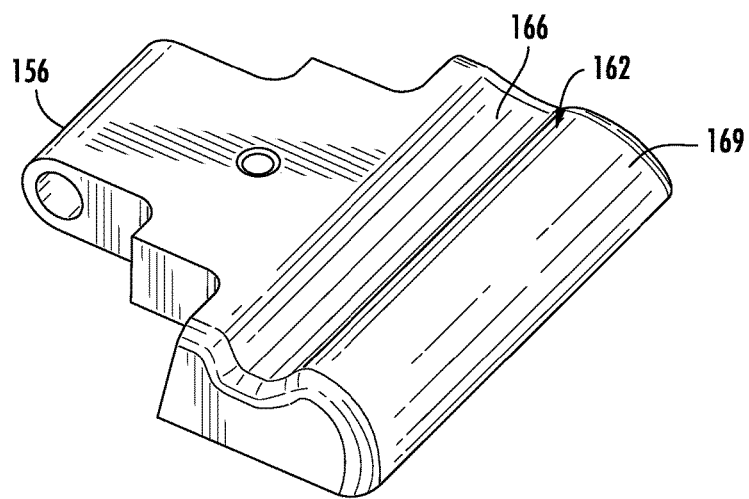
FIG. 4B illustrates a perspective view of an end effector, according to embodiments of the disclosure.

FIG. 4B illustrates a close-up perspective view of the second end effector 156, according to embodiments of the disclosure. To end effectors of the clamp tool 100 may be specially designed to provide superior coupling to the electrode insert 114. Referring also to FIG. 4A, the second end effector 156 and first end effector 154 may be designed similarly, where the first end effector 154 comprises a first inner surface 160, including a first groove 164, and where the second end effector 156 comprises a second inner surface 162, facing the first inner surface 160, where the second inner surface 162 includes a second groove 166. As discussed further with respect to FIG. 5A and FIG. 5B, the first groove 164 and the second groove 166 may be designed to mechanically couple to the electrode insert 114. Advantageously the first end effector 154 and second end effector 156 may be made of a polymer material tending not to abrade or to generate particles when engaging the electrode insert 114. For example, the first end effector 154 and second end effector 156 may be made of nylon. The embodiments are not limited in this context.

Figure 5B:
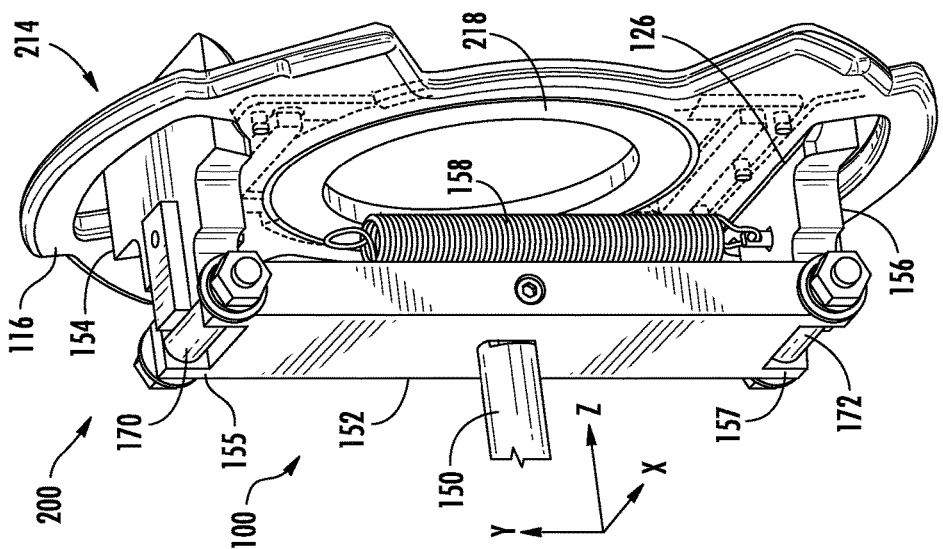
FIG. 5B illustrates a perspective view of the components of the electrode assembly of FIG. 5A in an engaged state.
Figure 5A:
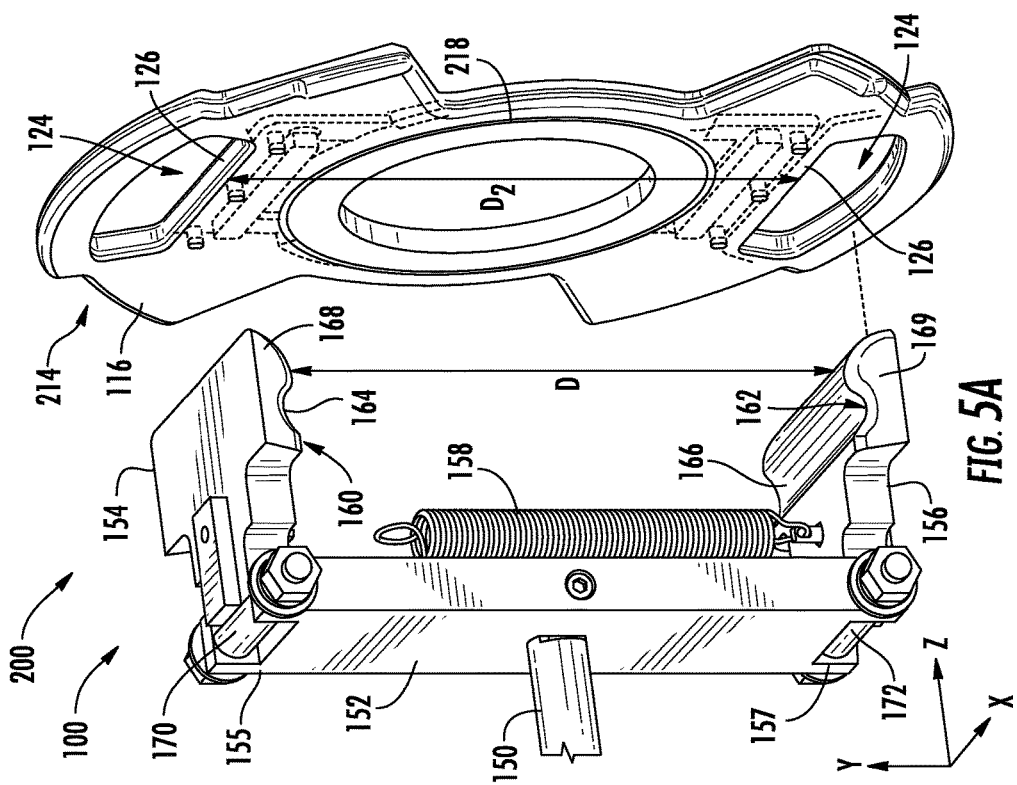
FIG. 5A illustrates a perspective view of components of an electrode assembly in a disengaged state.

Turning now to FIG. 5A, a perspective view is shown of components of an electrode assembly 200 in a disengaged state. In this embodiment, the electrode assembly 200 includes the clamp tool 100, as discussed above, and further includes an electrode insert 214. The electrode insert 214 may include the frame 116, while an inner portion 218 may differ in some details from the shape from the inner portion 118. In other embodiments an electrode assembly may be formed from the clamp tool 100 and the electrode insert 114. The clamp tool 100 and the electrode insert 214 or electrode insert 114 may be designed so that the clamp tool may readily mechanically couple to the electrode insert in question, and in particular to the frame 116.

As further shown in FIG. 5A, the clamp tool 100 may include a first pivot rod 170, where the first pivot rod 170 has a first pivot axis, which axis extends parallel to the X-axis in the Cartesian coordinate system shown. Thus, the first pivot axis extends perpendicularly to the shaft axis. As shown, the first pivot rod 170 is configured to engage the first end effector 154 and the first end 155 of the base 152, where the first end effector 154 is rotatable about the first pivot rod 170.

The clamp tool may also include a second pivot rod 172, where the second pivot rod 172 has a second pivot axis extending parallel to the first pivot axis. The second pivot rod 172 may be configured to engage the second end effector 156 and the second end 157 of the base 152, where the second end effector 156 is rotatable about the second pivot rod 172.

In the illustration of FIG. 5A, the first end effector 154 and the second end effector 156 are shown in a closed position. The spring 158 (not shown as attached to the first end effector 154 for clarity), when attached to the first end effector 154 and to the second end effector 156, generates a force urging the first end effector 154 and the second end effector 156 into the closed position. The first end effector 154 and the second end effector 156 may abut against the base 152 in a manner where the first end effector 154 and the second end effector 156 are prevented from rotating inwardly toward one another, past the point of the closed position illustrated in FIG. 5A. Accordingly, the first end effector 154 and the second end effector 156 may be limited to just rotate around their respective pivot axes away from one another from the position of FIG. 5A. In other words, as shown in FIG. 5A, a first distal end 168 of the first end effector 154 and a second distal end 169 of the second end effector 156 may be separated by a distance D in the closed position, where the distance D is a minimum in the closed position of FIG. 5A. The first distal end 168 and second distal end 169 may rotate away from one another so that the distance D increases in an open position.

Turning now to FIG. 5B the electrode assembly 200 is shown in an engaged state. The engaged state exists when the clamp tool 100 is clamped onto the frame 116, as shown. The engaged position is brought about when the clamp tool 100 is brought into contact with the frame 116. For example, the clamp tool 100 may be translated from the position of FIG. 5A along the Z-axis, while the openings 124 are aligned with the clamp tool 100 in a manner to accept the first end effector 154 and the second end effector 156. In the engaged state, the spring 158 exerts adequate force so as to hold the first end effector 154 and the second end effector 156 against the grip surfaces 126. In the engaged state, the shaft axis (represented by the Z-axis) is aligned with an electrode insert axis of the electrode insert 114. As such, the rotating of the shaft along the shaft axis, generates a rotation of the electrode insert along the shaft axis. Referring again to FIG. 3B, after sufficient rotation of the shaft axis, the electrode insert 114 may be rotated to a release position where the tabs 120 of an electrode 112 of the accelerator column 110 no longer engage the frame 116. As such, in the release position, the electrode assembly 200 may be removed from the accelerator column 110 that houses the given electrode, that is, the electrode 112. The removal may be accomplished by drawing the shaft 150 to the left generally along the Z-axis as shown.

Figure 5C:
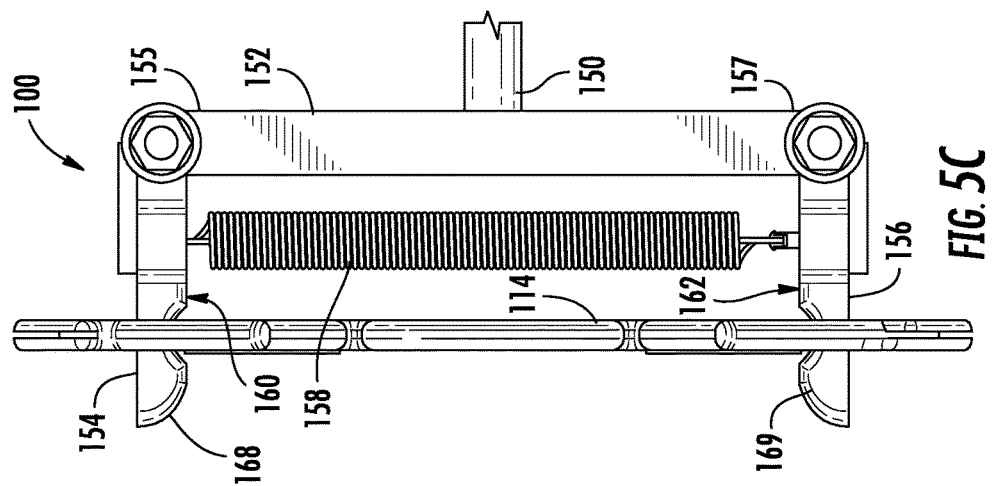
FIG. 5C illustrates a side view of the components of FIG. 5B in the engaged state.

To provide proper clamping and holding of the electrode insert 114, the first groove 164 and the second groove 166 may be arranged to extend parallel to the first pivot axis and the second pivot axis, so that the grip surfaces 126 of the frame 116 can be accommodated within the first groove 164 and the second groove 166. As more clearly shown in FIG. 5C, to facilitate engagement between the clamp tool 100 and the frame 116, the first inner surface 160 of the first end effector 154 may define a first convex shape at the first distal end 168, while the second inner surface 162 of the second end effector 156 defines a second convex shape at the second distal end 169. Referring also to FIG. 5A, the grip surfaces 126 may be separated from one another by a distance $D_2$, where the distance $D_2$ is greater than minimum value of the distance D, representing the separation between the first distal end 168 and the second distal end 169, in the closed position. As such, as the clamp tool 100 is translated to the right in the view of FIG. 5B, and is brought into contact with the frame 116, the convex shape allows the first end effector 154 and the second end effector 156 to readily rotate outwardly to an open position as the first distal end 168 and second distal end 169 enter the openings 124. As the clamp tool 100 continues to move to the right along the Z-axis with respect to the frame 116, the first groove 164 and the second groove 166 become aligned over the grip surfaces 126. At the same time, the spring 158 exerts a clamping force to rotate the first end effector 154 and the second end effector 156 back to a closed position, as shown in FIG. 5B.

Once arranged in the engaged position, the electrode assembly 200 may be removed as a unitary piece from an accelerator column by rotation of the electrode assembly 200 with respect to electrode 112, when the electrode 112 remains stationary, as noted. The electrode assembly 200 may then be removed as a unitary piece by withdrawing the electrode assembly along the Z-axis, for example, using a handle or other object disposed on the shaft 150.

Notably, any desired number of electrode inserts 114 may be withdrawn using the clamp tool 100. Subsequently, any needed maintenance may be performed on the accelerator column 110, while at least one electrode insert of the electrode inserts 114 is removed. Additionally, any maintenance or replacement of a removed electrode insert may be performed. Subsequently, an electrode insert 114 may be reinstalled in the accelerator column 110 by inserting the electrode assembly 200 into the accelerator column 110, rotating the electrode insert 114 into place to engage the electrode 112, such as via tabs 120, and releasing the electrode insert 114 from the clamp tool 100. Notably, the force exerted by the spring 158 may be arranged to provide adequate clamping for the clamp tool 100 to grip the electrode insert 114, while allowing the clamp tool 100 to release the frame 116 while the pulling force in the direction along the shaft axis is not excessive.

Figure 6:
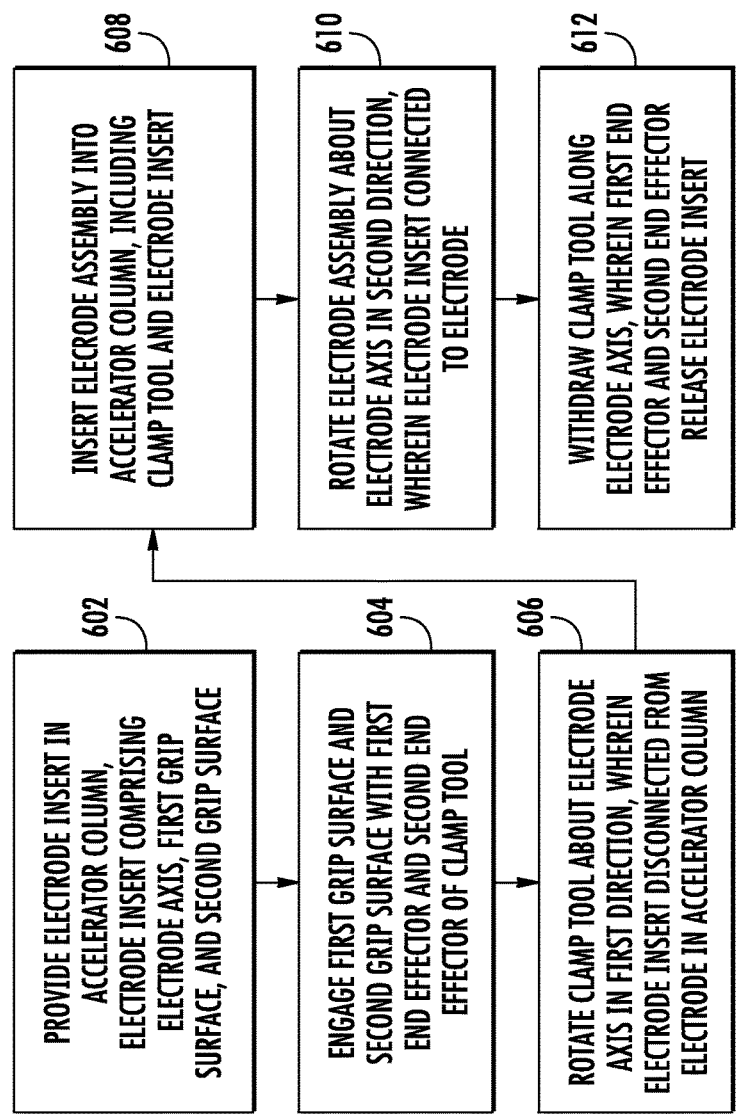
FIG. 6 provide an exemplary process flow according to some embodiments of the disclosure.

FIG. 6 depicts an exemplary process flow 600. At block 602, an electrode insert is provide in an accelerator column. The electrode insert may be defined by an electrode axis, and may include a first grip surface, and a second grip surface. The electrode insert may be connected to an electrode, among a plurality of electrodes in the accelerator column. In particular, the electrode insert may be reversibly attachable to the electrode.

At block 604, the first grip surface and second grip surface are engaged a with first end effector and a second end effector of a clamp tool. In various embodiments, the clamp tool may include a spring that is coupled between the first end effector and the second end effector, wherein the spring generates a force urging the first end effector to a first closed position and the second end effector to a second closed position, so as to clamp onto the first grip surface and the second grip surface.

At block 606, the clamp tool is rotated about the electrode axis in a first direction, such as a counterclockwise direction (or clockwise direction), wherein the electrode insert is disconnected from the electrode in the accelerator column. In some embodiments, the electrode may include tabs or other coupling features that retain the electrode insert so that rotation of the electrode insert with respect to the electrode may release the electrode insert from the electrode. The electrode insert may be subsequently removed from the accelerator column by withdrawing the electrode insert when attached to the clamp tool. In various embodiments, the accelerator column and the electrode insert may be cleaned or repaired.

At block 608, an electrode assembly is inserted into the accelerator column, where the electrode assembly includes the clamp tool and an electrode insert, held together to one another as a unitary object. In some instances, the electrode assembly may include a new electrode insert or refurbished electrode insert that was previously removed.

At block 610, the electrode assembly is rotated about the electrode axis in a second direction, such as a clockwise direction (or counterclockwise direction), where the electrode insert is connected to the electrode in the accelerator column. In some embodiments, this connection may be accomplished with the aid of tabs or other coupling features provided on the electrode.

At block 612, the clamp tool is withdrawn from the accelerator column along the electrode axis, where the first end effector and the second end effector release from the electrode insert. In some embodiments, the first end effector and second end effector may include a first groove and a second groove to engage the first grip surface and the second grip surface. When releasing from the electrode insert, the first end effector and the second end effector may rotate outwardly from one another to an open position.

There are multiple advantages provided by the present embodiments, including the ability to conveniently service components such as electrode inserts in an apparatus such as an accelerator column when the components are not otherwise manually accessible. Additionally, the present embodiments provide the ability to maintain accelerator columns, regardless of the depth of the accelerator column, by providing modular a clamp tool where the length of the clamp tool can be readily increased by simple replacement of the clamp shaft.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are in the tended to fall within the scope of the present disclosure. Furthermore, the present disclosure has been described herein in the context of a particular implementation in a particular environment for a particular purpose, while those of ordinary skill in the art will recognize the usefulness is not limited thereto and the present disclosure may be beneficially implemented in any number of environments for any number of purposes. Thus, the claims set forth below are to be construed in view of the full breadth and spirit of the present disclosure as described herein.

What is claimed is:

1. An apparatus, comprising:
a shaft;
a base, the base being affixed to a first end portion of the shaft, the base comprising a first end and a second end;
a first end effector, the first end effector being rotatably coupled to the first end of the base, wherein the first end effector is rotatable from a first closed position to a first open position;
a second end effector, the second end effector being rotatably coupled to the second end of the base, wherein the second end effector is rotatable from a second closed position to a second open position; and
a spring, the spring comprising a first spring end, the first spring end being coupled to the first end effector, the spring further comprising a second spring end, the second spring end being coupled to the second end effector.

2. The apparatus of claim 1, wherein the spring generates a force urging the first end effector to the first closed position and the second end effector to the second closed position.

3. The apparatus of claim 1, further comprising:
a first pivot rod, the first pivot rod having a first pivot axis and configured to engage the first end effector and the first end of the base, wherein the first end effector is rotatable about the first pivot rod; and
a second pivot rod, the second pivot rod having a second pivot axis and configured to engage the second end effector and the second end of the base, wherein the second end effector is rotatable about the second pivot rod, and wherein the first pivot axis extends parallel to the second pivot axis.

4. The apparatus of claim 3,
wherein the first end effector comprises a first inner surface, the first inner surface comprising a first groove; and
wherein the second end effector comprises a second inner surface, facing the first inner surface, the second inner surface comprising a second groove.

5. The apparatus of claim 4, wherein the first groove and the second groove extend parallel to the first pivot axis and the second pivot axis.

6. The apparatus of claim 4,
wherein the first end effector comprises a first distal end, and wherein the first inner surface defines a first convex shape at the first distal end,
and wherein the second end effector comprises a second distal end, and wherein the second inner surface defines a second convex shape at the second distal end.

7. The apparatus of claim 1, wherein the shaft and the base comprise a metal material.

8. The apparatus of claim 1, wherein the first end effector and the second end effector comprise a polymer.

9. The apparatus of claim 1, wherein the first end effector and the second end effector comprise nylon.

10. The apparatus of claim 1, wherein the shaft comprises a second end portion, the apparatus further comprising a handle, the handle coupled to the second end portion.

11. The apparatus of claim 1, wherein the shaft comprises a shaft length, the shaft length being at least 300 mm.

12. An electrode assembly, comprising:
an electrode insert, the electrode insert comprising a first grip surface and a second grip surface; and
a clamp tool, the clamp tool comprising:
a base, the base having a first end and a second end;
a first end effector, the first end effector being rotatably coupled to the first end of the base;
a second end effector, the second end effector being rotatably coupled to the second end of the base; and
a spring, the spring comprising a first spring end, the first spring end being coupled to the first end effector, the spring further comprising a second spring end, the second spring end being coupled to the second end effector,
wherein the first end effector and second end effector are arranged to generate a clamping force between the first grip surface and the second grip surface.

13. The electrode assembly of claim 12, the electrode insert comprising an electrode axis,
wherein the clamp tool further comprises a shaft, the shaft being connected to the base,
and wherein the shaft extends parallel to the electrode axis when the clamp tool is coupled to the electrode insert.

14. The electrode assembly of claim 12, wherein
wherein the first end effector is rotatable from a first closed position to a first open position; and
wherein the second end effector is rotatable from a second closed position to a second open position, and
wherein the spring generates a force urging the first end effector to the first closed position and the second end effector to the second closed position.

15. The electrode assembly of claim 12, the clamp tool further comprising:
a first pivot rod, the first pivot rod having a first pivot axis and configured to engage the first end effector and the first end of the base, wherein the first end effector is rotatable about the first pivot rod; and
a second pivot rod, the second pivot rod having a second pivot axis and configured to engage the second end effector and the second end of the base, wherein the second end effector is rotatable about the second pivot rod, and wherein the first pivot axis extends parallel to the second pivot axis.

16. The electrode assembly of claim 15,
wherein the first end effector comprises a first inner surface, the first inner surface comprising a first groove; and
wherein the second end effector comprises a second inner surface, facing the first inner surface, the second inner surface comprising a second groove, and
wherein the first groove and the second groove extend parallel to the first pivot axis and the second pivot axis.

17. A method of maintaining an accelerator column, comprising:
- providing an electrode in the accelerator column;
- inserting a clamp tool into the accelerator column when an electrode insert is coupled to the electrode, wherein the electrode insert comprises an electrode axis, a first grip surface and a second grip surface;
- engaging the first grip surface and the second grip surface of the electrode insert with a first end effector of the clamp tool, and a second end effector of the clamp tool, respectively; and
- rotating the clamp tool about the electrode axis in a first direction, wherein the electrode insert is disconnected from the electrode.

18. The method of claim 17, further comprising:
- inserting an electrode assembly into the accelerator column, wherein the electrode assembly comprises the electrode insert and the clamp tool;
- rotating the electrode assembly about the electrode axis in a second direction, opposite to the first direction, wherein the electrode insert is connected to the electrode; and
- withdrawing the clamp tool along the electrode axis, wherein the first end effector and the second end effector release the first grip surface and the second grip surface, respectively.

* * * * *